United States Patent [19]
Mehring

[11] Patent Number: 5,984,732
[45] Date of Patent: Nov. 16, 1999

[54] METHOD AND APPARATUS FOR INTERCONNECTION OF MODULAR ELECTRONIC COMPONENTS

[75] Inventor: Peter A. Mehring, Los Altos, Calif.

[73] Assignee: UMAX Computer Corporation, Santa Clara, Calif.

[21] Appl. No.: 08/970,659

[22] Filed: Nov. 14, 1997

[51] Int. Cl.⁶ .................................................. H01R 13/514
[52] U.S. Cl. .......................................................... 439/701
[58] Field of Search .............................. 439/74, 76.1, 69, 439/928, 502, 717, 701

[56] References Cited

U.S. PATENT DOCUMENTS

| | | | |
|---|---|---|---|
| 3,340,439 | 9/1967 | Henschen et al. | 439/69 |
| 4,733,461 | 3/1988 | Nakano | 29/830 |
| 5,676,553 | 10/1997 | Leung | 439/74 |
| 5,825,627 | 10/1998 | Tamura | 361/730 |

*Primary Examiner*—Lincoln Donovan
*Assistant Examiner*—Eugene G. Byrd
*Attorney, Agent, or Firm*—Blakely, Sokoloff, Taylor & Zafman LLP

[57] ABSTRACT

A method and an apparatus for interconnection of modular electronic components are provided. At least one foot is located on the bottom side of a component for providing mechanical support to the component. At least one receptacle is located on the top side of the component. The size and number of the receptacles correspond to the size and number of the feet. The feet contain at least one electrical connector. When multiple components are stacked, the receptacles of the lower component accept the corresponding feet and electrical connectors of the upper component thereby forming an electrical connection. The modular electronic components comprise computer components and stereo system components. The electrical connections comprise power connections and signaling connections.

15 Claims, 6 Drawing Sheets

METHOD AND APPARATUS FOR INTERCONNECTION OF MODULAR ELECTRONIC COMPONENTS

FIELD OF THE INVENTION

This invention relates to modular electronic components. More particularly, this invention relates to the interconnection of modular components using internal connections.

BACKGROUND OF THE INVENTION

Personal computer (PC) systems are available in many different configurations as a consequence of the many different brands and types of components and accessories available for PC systems. These different components include, but are not limited to, memory, disk drives, hard drives, modems, sound units, and audio/video tuners. Therefore, when a consumer orders or purchases a PC, they are able to specify a custom system by specifying the amount and type of memory, the size, type, and number of disk drives, the size of the hard drive, the type and speed of modem, the type of sound unit, and the type of tuner if a tuner is desired.

These build-to-order systems can be problematic for the PC manufacturer. Typically, the PC manufacturer markets and produces a basic system. Following receipt of an order, these basic systems are reconfigured to the individual purchaser's specifications and then shipped. This process of reconfiguring a previously produced system takes additional time and causes the PC manufacturer to incur additional cost and risk. The additional cost and risk arises because the more these systems are handled the higher the probability for broken connections, misinstalled components, and misconfigured systems.

As a result of the large number and variety of computer systems and components available in the marketplace, consumers are constantly performing their own system upgrades, upgrades that involve swapping out PC components, and installing new PC components in their own systems. While these swaps and installations are feasible, they involve some technical knowledge on the part of the consumer making the installation. While these swaps and installations require the consumer to open up their PC systems and remove and replace components, the risk is high for misinstallation or broken wires or connections while one is rummaging around inside their PC.

Consequently, there is a requirement for a modular PC system in which a base unit is supplemented with additional modular components that include, but are not limited to, memory, disk drives, hard drives, modems, and tuners. Therefore, the modular PC system would be analogous to the modular audio/video systems currently on the market thereby allowing the consumer to purchase particular peripheral components like compact disk players and tape players for connection to and use with a base unit, or receiver.

The problem that inheres in a modular PC system configuration is a cabling problem. For example, the typical computer system user will likely require a memory component, at least two disk drive components, a hard drive component, and a modem component. Each of these separate components is required to have power supply connections and to have electrical signal connections to the base unit. When external cabling is used a problem is encountered in that the number of cables in this system becomes unmanageable. This type of modular system and the problem encountered with connections between components is again analogous to the typical stereo system.

Prior art computer manufacturers have used two methods for dealing with this problem. In one prior art computer server system, a vertical riser card is coupled to the computer motherboard of each component. The vertical riser card is configured internally to run vertically through the middle of the component housing and is accessed through an opening in the top and the bottom of the component housing. In this manner, components are coupled together by placing them on top of one another and connecting the riser cards of each component. The problem with this system is that the computer system bus resided on the riser card making this alternative very expensive, and provided only limited expandability.

Another prior art computer system uses rigid external cables between disk drive components. The rigid cables contain all of the cables necessary for connection of the components in a single rigid housing having connectors spaced so that all components could be supported with connections when stacked. One rigid cable supplied power to all of the components, and another rigid cable supplied the small computer system interface (SCSI) bus interconnect for the components. This system, while only supporting disk drive components, does not eliminate the problem of the external cable connections, it only serves to localize the cables. Consequently, there is a requirement for an interconnection system that connects a number of modular electronic components using simple inexpensive internal connections between components instead of coupling the component buses or using multiple external cables.

SUMMARY OF THE INVENTION

A method and an apparatus for interconnection of modular electronic components are provided. According to one aspect of the invention, at least one foot is located on the bottom side of a component for providing mechanical support to the component. At least one receptacle is located on the top side of the component. The size and number of the receptacles correspond to the size and number of the feet. The feet contain at least one electrical connector. When multiple components are stacked, the receptacles in the top of the lower component accept the corresponding feet and electrical connectors of at least one upper component thereby forming an electrical connection. The modular electronic components comprise computer components and audio/video system components. The electrical connections comprise power connections. The electrical connections also may comprise signaling connections.

These and other features, aspects, and advantages of the present invention will be apparent from the accompanying drawings and from the detailed description and appended claims which follow.

BRIEF DESCRIPTION OF THE DRAWINGS

The present invention is illustrated by way of example and not limitation in the figures of the accompanying drawings, in which like references indicate similar elements and in which.

DETAILED DESCRIPTION

A method and an apparatus for interconnection without cables of modular electronic components are provided. In the following description, for purposes of explanation, numerous specific details are set forth in order to provide a thorough understanding of the present invention. It will be evident, however, to one skilled in the art that the present invention may be practiced without these specific details. In other instances, well-known structures and devices are shown in block diagram form in order to avoid unnecessarily obscuring the present invention.

Figure 1:
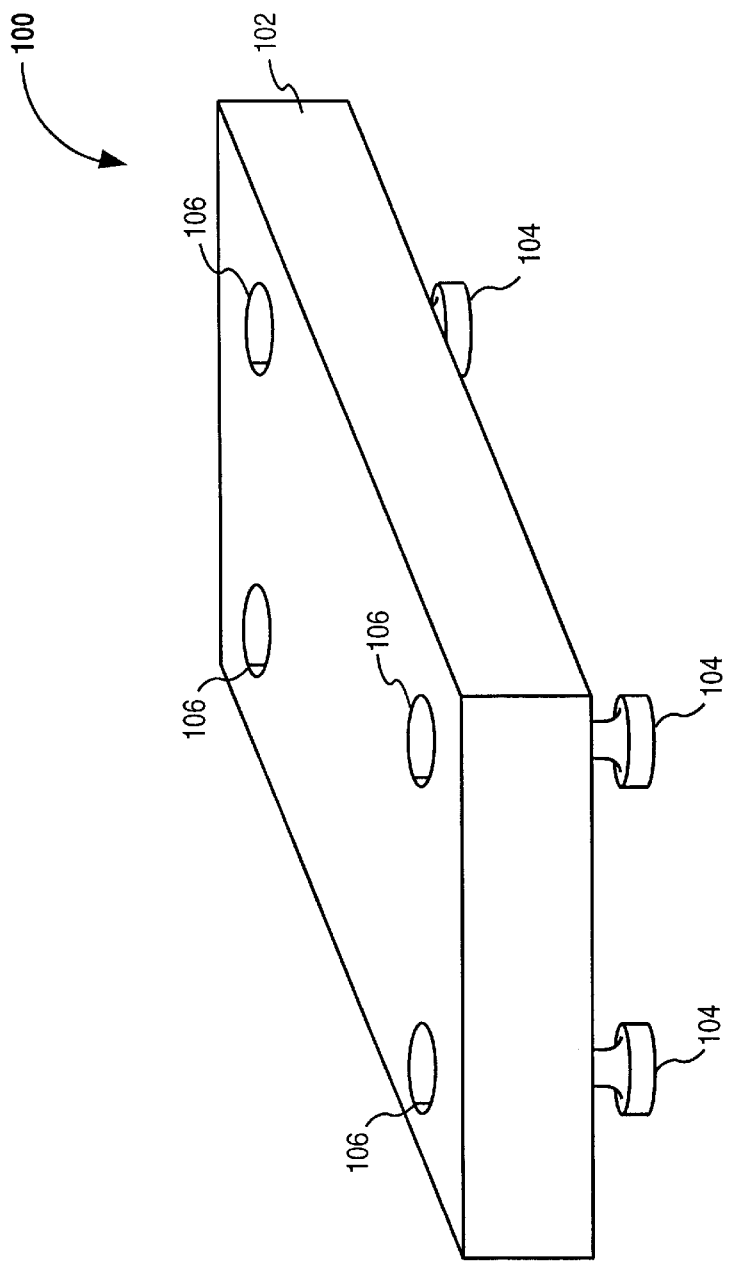
FIG. 1 is a component of one embodiment.

FIG. 1 is a component 100 of one embodiment. This component 100 comprises a housing 102 having four feet 104 located on the bottom of the housing 102 and four receptacles 106 located on the top of the housing 102, but is not so limited. In one embodiment the housing is a 3.5 inch/5 inch wide drive bay enclosure form factor, but is not so limited. The housing may contain electronics comprising computer components, but is not so limited. The housing may contain electronics comprising audio or video components, but is not so limited. The four feet 104 are received by the receptacles of a second component when this component 100 is placed on top of the second component. The four feet 104 may sit directly on a support surface like a desk or table top.

Figure 2:
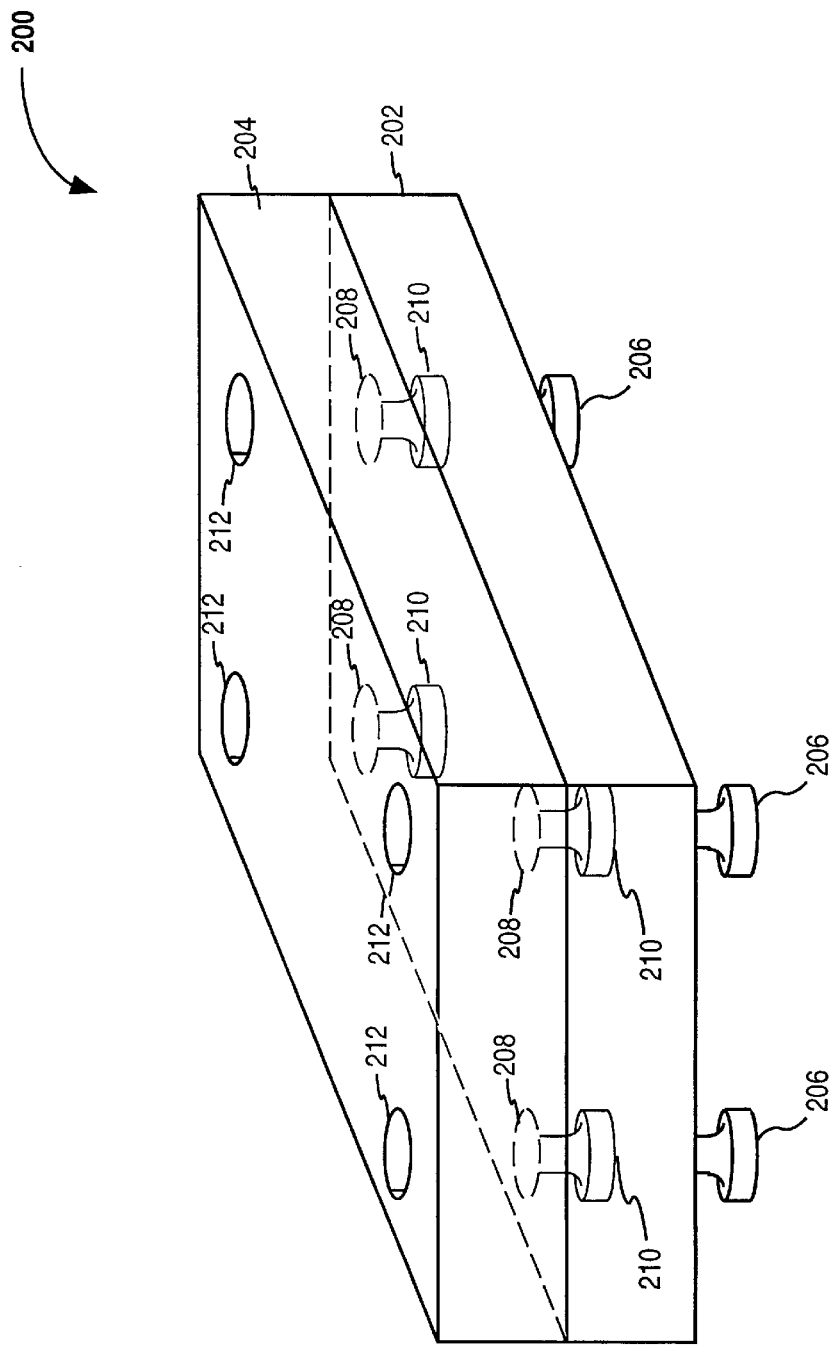
FIG. 2 is a system of modular electronic components in one embodiment.

FIG. 2 is a system of modular electronic components 200 in one embodiment. This system comprises two components 202 and 204, but is not so limited. A first component 202 is supported on a surface by four feet 206, but is not so limited. In one embodiment the first component 202 is a network personal computer (net PC). In an alternate embodiment the first component 202 is an audio/video component. Four receptacles 208 in the top of the first component 202 receive the four feet 210 on the bottom of a second component 204 when the second component 204 is placed on top of the first component 202. The first component 202 provides mechanical support to the second component 204. Furthermore, as discussed herein, the first component 202 provides electrical power connections to the second component 204. Moreover, the first component 202 may provide signal connections to the second component 204. Additional components may be added to the system 200 in which case the feet of the additional components are accepted by the receptacles 210 in the top of the second component 204.

Figure 3:
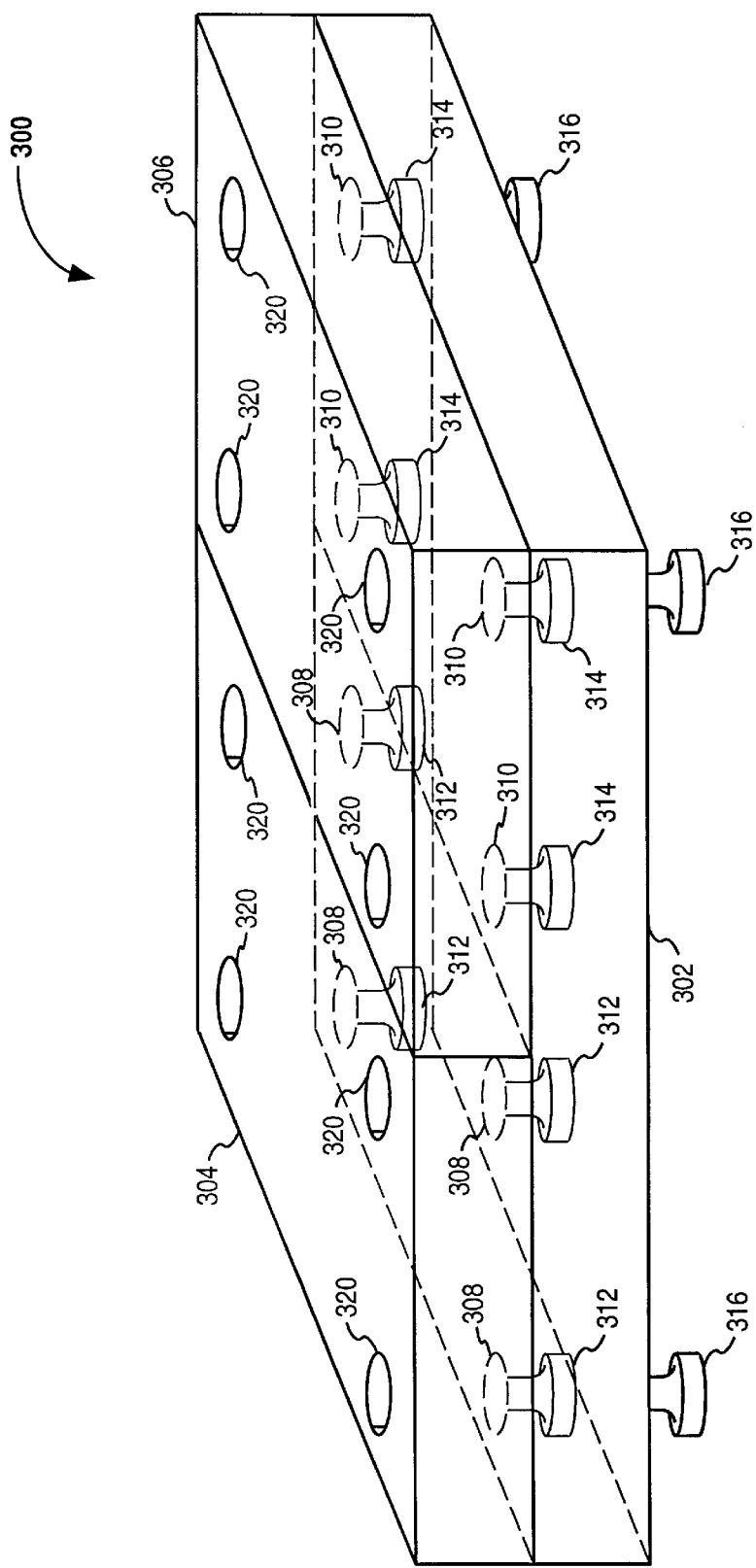
FIG. 3 is another embodiment of a system of modular electronic components.

FIG. 3 is another embodiment of a system of modular electronic components 300. This system comprises three components 302–306, but is not so limited. A first component 302 is supported on a surface by four feet 316, but is not so limited. In one embodiment the first component 302 is a net PC. In an alternate embodiment the first component 302 is an audio/video component. A first set of four receptacles 308 in the top of the first component 302 receive the four feet 312 on the bottom of a second component 304 when the second component 304 is placed on top of the first component 302. A second set of four receptacles 310 in the top of the first component 302 receive the four feet 314 on the bottom of a third component 306 when the third component 306 is placed on top of the first component 302. The first component 302 provides mechanical support to the second 304 and third 306 components. Furthermore, as discussed herein, the first component 302 provides electrical power connections to the second 304 and third 306 components. Moreover, as discussed herein, the first component 302 provides electrical signal connections to the second 304 and third 306 components. Alternatively, two of the receptacles from the first set of four receptacles 308 and two of the receptacles from the second set of four receptacles 310 in the top of the first component 302 may receive four feet of a fourth component. The fourth component may be of the same size as either the first component 302 or the second component 304. Additional components may be added to the system 300 in which case the feet of the additional components are accepted by the receptacles 320 in the top of the second 304 and third 306 components. The additional components may be large size components similar in size to component 302 or small size components similar in size to component 304.

This modular system interconnect allows the end user of the computer or audio/video system to configure or upgrade their system to any one of a large number of configurations without cables. This configuration is performed by simply interconnecting the components desired without the need to internally reconfigure a particular component, or require external cables for interconnect.

Figure 4:
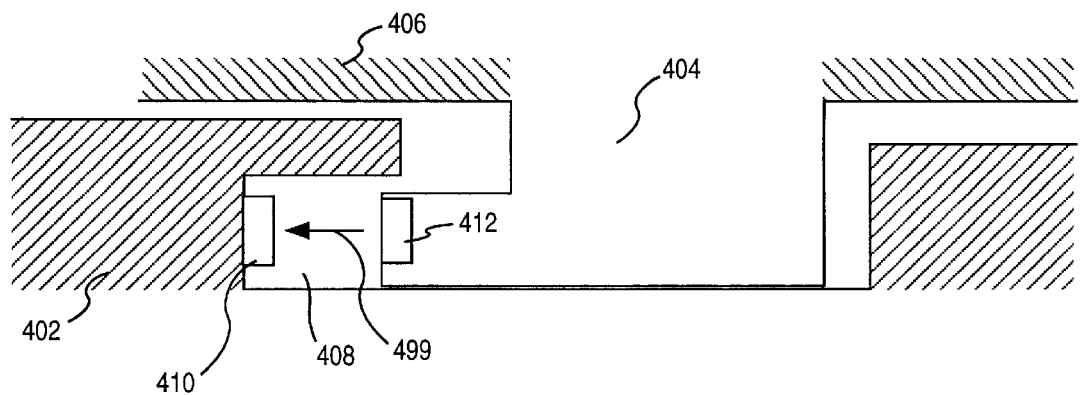
FIG. 4 shows a receptacle of one component receiving a foot of another component prior to electrical coupling of the two components in one embodiment.
Figure 5:
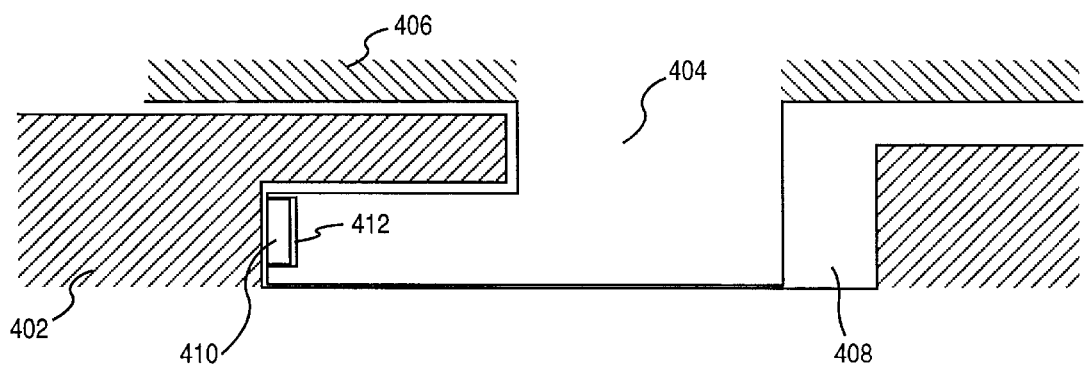
FIG. 5 shows a receptacle of one component receiving a foot of another component after electrical coupling of the two components in one embodiment.

FIGS. 4 and 5 show the interconnection of modular components of one embodiment. FIG. 4 shows a receptacle 408 of one component 402 receiving a foot 404 of another component 406 prior to electrical coupling of the two components 402 and 406 in one embodiment. FIG. 5 shows a receptacle 408 of one component 402 receiving a foot 404 of another component 406 after electrical coupling of the two components 402 and 406 in one embodiment. In one embodiment, two components are coupled together by placing the feet of one component into the corresponding receptacles of another component. A coupling will be described for one foot and receptacle combination as all feet and receptacles use the same or similar coupling method and apparatus.

The diameter of a receptacle 408 is slightly larger than the diameter of the corresponding foot 404, and both are circular in shape, but are not so limited. The foot 404, once in the receptacle 408 of a component 402, provides mechanical support to the top component 406. After the foot 404 is placed into the receptacle 408, the top unit 406 is slid 499 to a side with respect to the bottom unit 402 in order to engage a connector 412 located in the side of the foot 404 with a connector 410 located in the corresponding side of the receptacle 408. In an alternate embodiment, the top unit 406 is slid forward to engage a connector 412 located in the front of the foot 404 with a connector 410 located in the front of the receptacle 408. In another alternate embodiment, the top unit 406 is slid rearward to engage a connector 412 located in the rear of the foot 404 with a connector 410 located in the rear of the receptacle 408.

Figure 6:
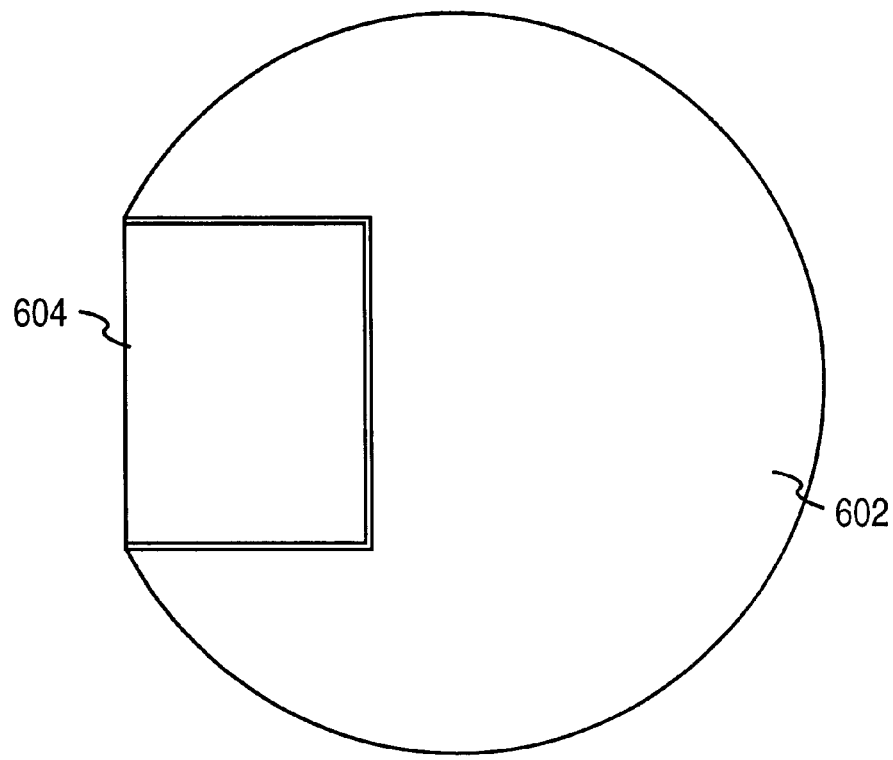
FIG. 6 is the bottom view of a foot with a connector of one embodiment.

The electrical connections of one embodiment are made by coupling a male connector located in the foot to a female connector located in the receptacle. In an alternate embodiment, the male connector is located in the receptacle and the female connector is located in the foot. These electrical connections comprise power connections connections. Moreover, these electrical connections may comprise signaling connections. The connectors may be of the following type, but are not so limited. IEEE 1394 "Firewire"; Universal Serial Bus; and a low voltage direct current power connector. FIG. 6 is the bottom view of a foot 602 with a connector 604 of one embodiment.

Figure 7:
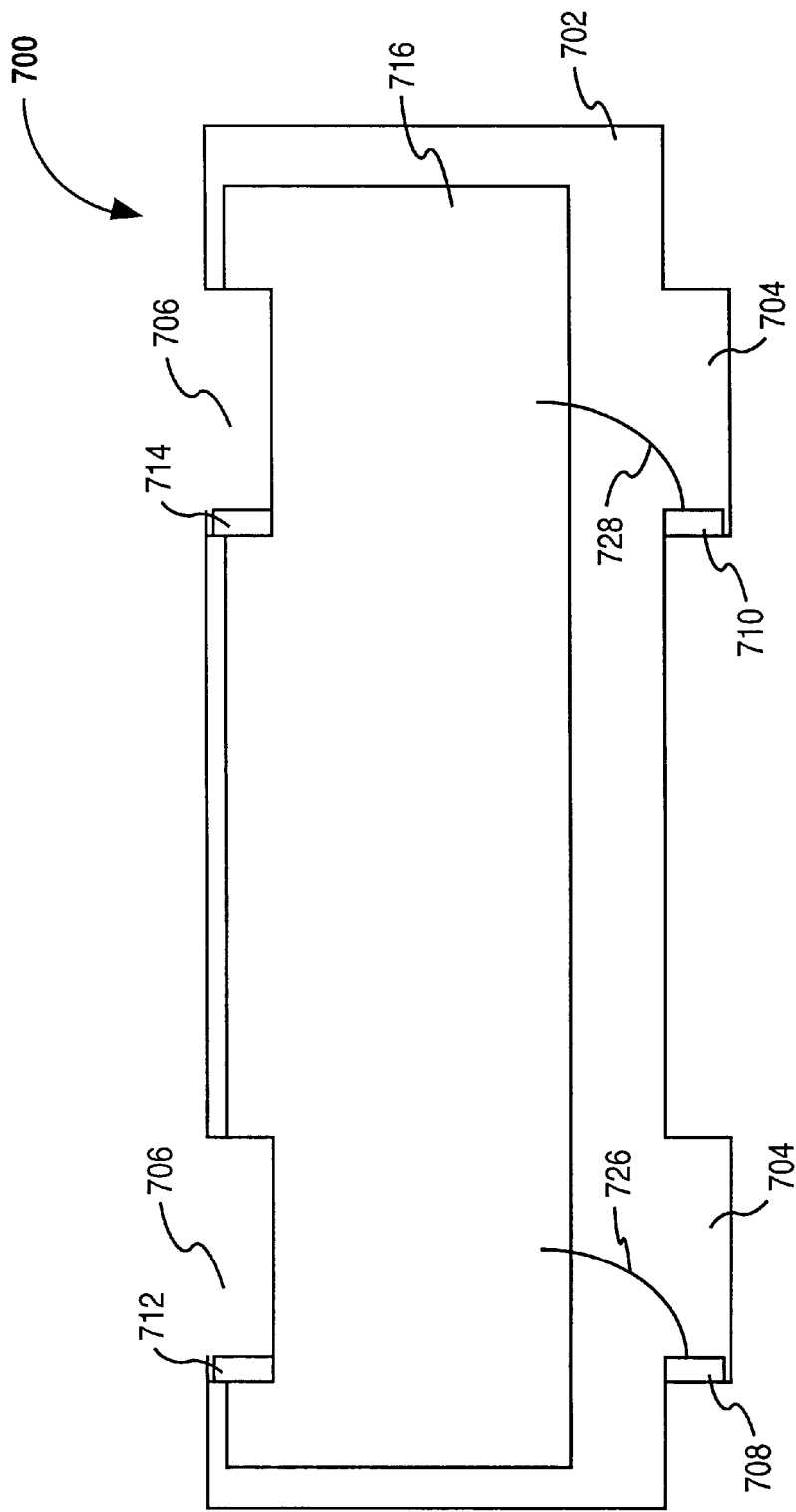
FIG. 7 is a cross-section of a component showing the connections of one embodiment.

FIG. 7 is a cross-section 700 of a component 702 showing the connections of one embodiment. The component 702 comprises at least one printed circuit card 716, but is not so limited. The connectors 712–714 located in the receptacles 706 of the component 702 are attached directly to the printed circuit board 716, but are not so limited. The connectors 708–710 located in the feet 704 of the component 702 are coupled to the printed circuit board 716 using flexible wiring 726 and 728, respectively, but are not so limited. In this manner, the interconnections of all system components are chained through a component.

Thus, a method and an apparatus for cableless interconnection of modular electronic components have been provided. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. An apparatus for connecting a plurality of modular electronic components, the apparatus comprising:
   at least one foot located on a first side of a first component, the at least one foot supporting the component;
   at least one receptacle located on a second side of a second component, the second side being opposite a first side of the second component; and
   at least one electrical connector located in the at least one foot, wherein the at least one receptacle accepts the at least one electrical connector to form an electrical connection when the first component is placed on top of the second component.

2. The apparatus of claim 1, wherein the electrical connection comprises power connections.

3. The apparatus of claim 1, wherein the electrical connection comprises signaling connections.

4. The apparatus of claim 1, wherein the modular electronic components are computer components.

5. The apparatus of claim 4, wherein the plurality of modular electronic components comprise at least one hard drive and at least one disk drive.

6. The apparatus of claim 4, wherein the modular electronic components comprise at least one modem.

7. The apparatus of claim 4, wherein the modular electronic components comprise at least one audio component.

8. The apparatus of claim 4, wherein the modular electronic components comprise at least one video component.

9. The apparatus of claim 1, wherein the modular electronic components comprise a plurality of audio and video components.

10. A system of modular electronic components, the system comprising:
    a first component comprising at least one foot located on a first side, the at least one foot supporting the component;
    a second component comprising at least one receptacle located on a second side, the second side being opposite a first side of the second component, wherein at least one electrical connector is located in the at least one foot, the at least one receptacle accepting the at least one electrical connector to form an electrical connection when the first component is placed on top of the second component.

11. The system of claim 10, wherein the electrical connection comprises power connections and signaling connections.

12. The system of claim 10, wherein the modular electronic components comprise computer components.

13. The system of claim 10, wherein the modular electronic components comprise audio and video system components.

14. The system of claim 10, wherein an electrical connection is formed when a third component is placed on top of the second component.

15. The system of claim 10, wherein an electrical connection is formed when a third component is placed on top of the first component.

* * * * *